(12) United States Patent
Watanabe et al.

(10) Patent No.: US 6,768,315 B2
(45) Date of Patent: Jul. 27, 2004

(54) VOLTAGE MEASURING APPARATUS FOR SHEATHED POWER CABLE

(75) Inventors: Masahiro Watanabe, Hitachi (JP); Kazuo Kato, Mito (JP); Masayuki Tani, Hitachinaka (JP); Ikurou Masuda, Hitachi (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/984,436

(22) Filed: Oct. 30, 2001

(65) Prior Publication Data

US 2002/0171433 A1 Nov. 21, 2002

(30) Foreign Application Priority Data

May 16, 2001 (JP) .................................. 2001-145768

(51) Int. Cl.[7] .............................. H04B 3/46; G01R 31/08
(52) U.S. Cl. ...................... 324/539; 324/519; 324/522
(58) Field of Search ............................... 324/519, 522, 324/543, 609, 632, 658, 72.5, 96, 126; 340/870.28

(56) References Cited

U.S. PATENT DOCUMENTS

| | | | | |
|---|---|---|---|---|
| 4,121,154 A | * | 10/1978 | Keating | 324/126 |
| 4,316,254 A | * | 2/1982 | Levin | 702/72 |
| 4,510,442 A | * | 4/1985 | Neher | 324/99 R |
| 4,795,973 A | * | 1/1989 | Smith-Vaniz et al. | 324/126 |
| 5,077,520 A | * | 12/1991 | Schweitzer, Jr. | 324/133 |
| 5,473,244 A | * | 12/1995 | Libove et al. | 324/126 |
| 5,574,378 A | * | 11/1996 | Meyer et al. | 324/541 |
| 6,470,283 B1 | * | 10/2002 | Edel | 702/64 |

FOREIGN PATENT DOCUMENTS

| | | |
|---|---|---|
| JP | A-64-58739 | 3/1989 |
| JP | A-5-26907 | 2/1993 |

* cited by examiner

*Primary Examiner*—N. Le
*Assistant Examiner*—Vincent Q. Nguyen
(74) *Attorney, Agent, or Firm*—Dickstein Shapiro Morin & Oshinsky LLP

(57) ABSTRACT

The measuring precision of an electric power measuring apparatus is improved. A voltage measuring apparatus for sheathed power cable is disclosed as including; a first conductive member arranged to contact the sheathing material for sheathing a power cable conductor, a second conductive member for forming a capacitance between the ground and itself, current voltage converting operation for converting a current signal flowing between the first conductive member and the second conductive member into a voltage signal having a waveform proportional to the current signal, and a voltage value calculating operation for calculating the voltage value applied to the power cable from the signal converted by the current voltage converting operation.

13 Claims, 13 Drawing Sheets

(a)

(b)

FIG. 20(a)    FIG. 20(b)    FIG. 20(c)
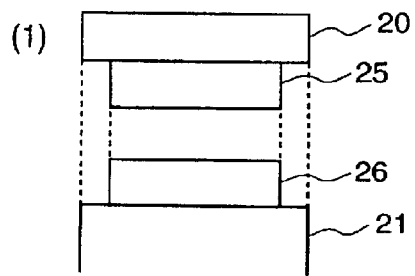
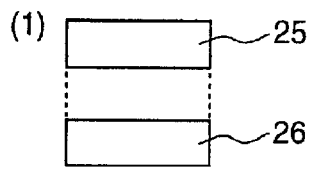
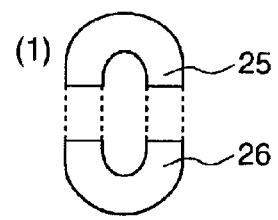
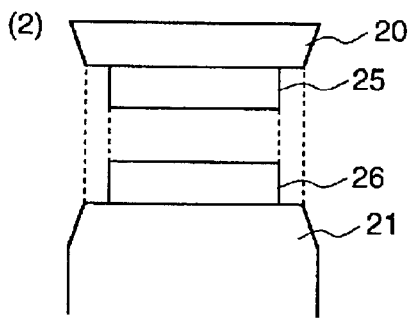
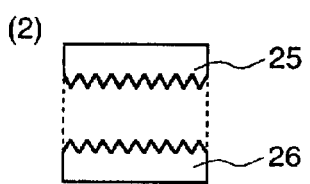
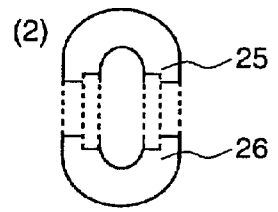
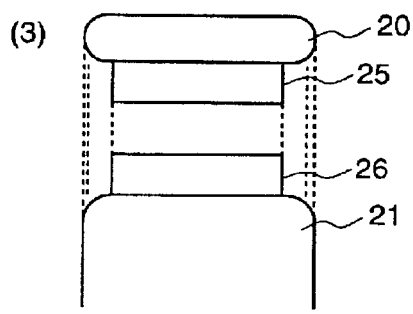
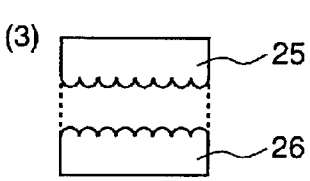
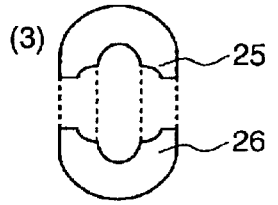
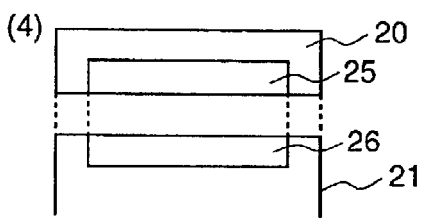

VOLTAGE MEASURING APPARATUS FOR SHEATHED POWER CABLE

BACKGROUND OF THE INVENTION

The present invention relates to the voltage measuring technique for sheathed power cable laid out on an urban district comprising a sheathing material where high voltage is applied.

The current power distribution system is connected with a great variety of the loads of the users having different peaks of power demands or the users having power requirements greatly differing with time, as well as with a great variety of generators including decentralized power sources. To verify whether users are supplied with electric power produced by these generators, electric power measuring apparatuses for power cable must be installed at various positions of the power distribution system.

Generally, the electric power measuring apparatus for power cable can be classified according to the application, for example, according to whether it is sheathed power cable or bare power cable (power cable with bare cable conductor), or according to the structure of the electric power measuring apparatus, according to whether it is of grounded or ungrounded type.

One of the prior art voltage measuring apparatuses for sheathed power cable of non-contact type is found in the Japanese Application Patent Laid-Open Publication No. Hei 05-26907. According to this Publication, a capacitance voltage divider for high voltage is used to divide the voltage applied to the parasitic capacitance to ground formed between the sheathing material of the sheathed power cable and the ground surface. The divided voltage is subjected to optical detection using a pockels device. FIG. 2 illustrates this description in terms of an equivalent circuit. In other words, the parasitic capacitance to ground Cs of about 1 pF and serial voltage-divided capacitance Cd are connected to the power cable through coupling capacitance Cc by the power cable sheath, thereby detecting the terminal voltage of the voltage-divided capacitance Cd using a pockels device.

Further, one of the prior art voltage measuring apparatus for bare power cable of contacted type is found in the Japanese Application Patent Laid-Open Publication No. Hei 01-58739.

SUMMARY OF THE INVENTION

In the prior art, measurement of the voltage applied to the cable conductor of the sheathed power cable installed in the urban district is likely to be affected by the resistance of surface leakage due to contamination of the sheathing material, rain or snow. Moreover, voltage requires a high measuring precision for operational purposes. This has made it difficult to meet such voltage measurement requirements.

In the art disclosed in Japanese Application Patent Laid-Open Publication No. Hei 01-26907, the operation voltage of the pockels device having the required sensitivity is as high as several hundred volts, so the value of voltage-divided capacitance Cd is reduced about 10 pF, with the result that the voltage divider is necessarily composed of a series circuit of small capacitance (three capacitors). Accordingly, multiple joints of high impedance as shown in a and b are formed, resulting in an increased sensitivity to leak resistor R11 on the surface of the voltage measuring apparatus enclosure generated with respect to the joints and leak resistor R12 on the surface of the power cable sheath. Thus, the leak current of on the order of GΩ cannot be ignored, and there is a limit in terms of principle when consideration is given to protect against the influence of the environment including rain, icy snow, dust, salt damage and others. In other words, this method is not insufficient to provide against possible deterioration of precision due to the environment.

The art disclosed in Japanese Application Patent Laid-Open Publication No. Hei 01-58739 relates to a voltage measuring apparatus for shaft power cable. This is not applicable to the measurement of voltages of sheathed power cables used in Japanese urban districts.

Furthermore, the prior arts explained above do not provide a jointing member capable of fixing the voltage measuring apparatus in position without damaging the power cable.

The object of the present invention is to improve measuring precision in an voltage measuring apparatus for sheathed power cable.

Another object is to provide a voltage measuring apparatus for sheathed power cable where the sheathed power cable can be protected.

One embodiment of the present invention is a voltage measuring apparatus for sheathed power cable comprising;

a first conductive member arranged to contact the sheathing material for sheathing a power cable conductor, a second conductive member for forming a capacitance between the ground and itself, a current voltage converting means for conversion into the voltage signal having a waveform proportional to the current signal flowing between the first conductive member and the second conductive member, and a voltage value calculating means for calculating the voltage value applied to the power cable from the voltage signal converted by the current voltage converting means. Another embodiment is a voltage measuring apparatus for sheathed power cable comprising;

a first conductive member arranged below the sheathing material for sheathing a power cable conductor, a second conductive member arranged below the first conductive member, a current voltage converting means for conversion into the voltage signal having a waveform proportional to the current signal flowing between the first conductive member and the second conductive member, and a voltage value calculating means for calculating the voltage value applied to the power cable from the voltage signal converted by the current voltage converting means and gain coefficient.

As described above, the current connected in series between the first and second conductive members and flowing these conductive members is changed into the voltage having the waveform proportional to this current, and the voltage value applied to the sheathed power cable is obtained from the waveform of the converted voltage. This reduces the influence of leak resistance, thereby ensuring a high precision of the voltage value applied to the cable conductor of the power cable.

When the voltage applied to the power cable is calculated from the voltage converted by this current voltage converting means, the root-mean-square value of the converted voltage is found out, and this root-mean-square value further is operated using the gain count thereby getting the voltage. This method is possible because the root-mean-square value is calculated by the gain count obtained from the relationship between the current proportional to the waveform of the voltage applied to the power cable conductor and the voltage applied to the power cable conductor, and the relationship with voltage proportional to that current waveform.

A large coupling capacitance can be ensured by the arrangement made to ensure that the first conductive member has a certain area. This substantially eliminates the voltage dividing point of small capacitance sensitive to leakage.

When the first conductive member is made of a member softer than the sheathing material or more elastic one, the voltage measuring apparatus for sheathed power cable can be installed in such a way that possible damages to the sheathed power cable and/or heating material can be reduced.

The first conductive member is preferred to be made of rubber, sponge or sponge consisting of rubber. Further, it can be verified by experiments that silicone is a suitable material constituting the first conductive member.

The power cable voltage measuring apparatus may be subjected to deterioration of measuring precision after a long-term use.

To solve this problem, the power cable voltage measuring apparatus according to the present invent includes an embodiment where a gain coefficient rewriting means is provided to rewrite the gain coefficient in the power cable voltage measuring apparatus in conformity to the installation environment.

Precision can be improved by this means for repeating rewriting.

The present invention also includes an embodiment comprising a gain count transmission means for sending from the outside the gain coefficient to be rewritten by the gain count rewriting means.

In the embodiment where a radio communications means is used as this transmission means, wired connection with the outside is completely eliminated with the result that there is no salt damage or leakage which would be caused by the use of wired connection.

Measuring precision may be reduced by reduction in potential on the surface of the power cable sheath due to salt damage or the like. To avoid the reduction in measuring precision, the present invention provides an embodiment comprising a means for making the voltage on the surface of the sheathing material almost the same as the voltage applied to the power cable conductor. One of the variations of this embodiment comprises a metallic pin for electric conduction with the power cable conductor and a ring-formed conductive rubber having an electric connection with this metallic pin.

BRIEF DESCRIPTION OF THE DRAWINGS

FIGS. 20(a) through 20(c) are diagrams representing the details of a conductive ring.

DESCRIPTION OF THE PREFERRED EMBODIMENTS

Figure 1:
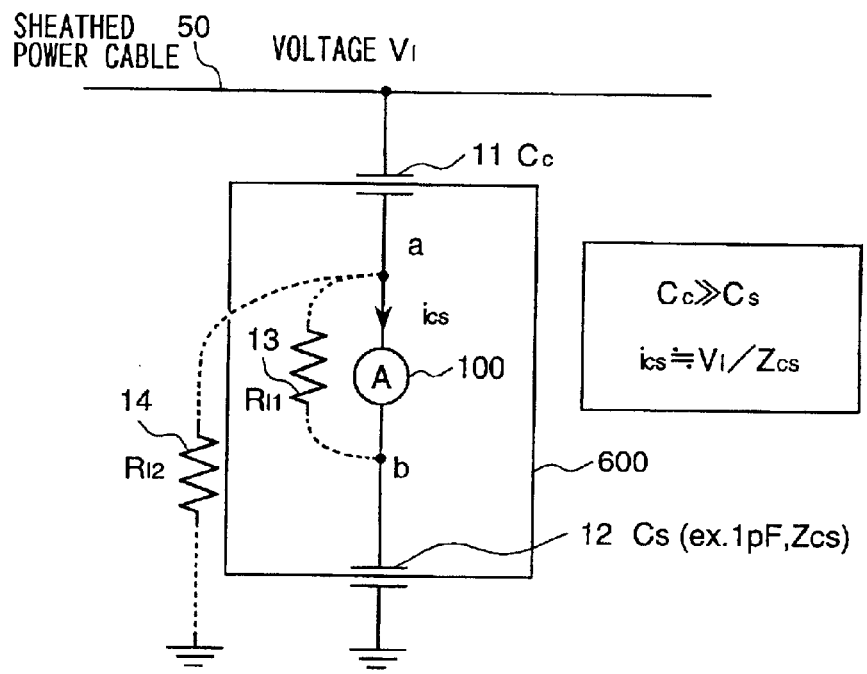
FIG. 1 is a circuit diagram representing the basic principle of a power cable voltage measuring apparatus according to the present invention.

FIG. 1 is an equivalent circuit representing the basic principle of a voltage measuring system using a sheathed power cable voltage measuring apparatus 600 according to the present invention (hereinafter referred to as "voltage measuring apparatus 600").

This voltage measuring system comprises a voltage measuring apparatus 600 and a sheathed power cable 50. The voltage measuring apparatus 600 is suspended on the sheathed power cable 50 when used. It measures voltage Vi of the cable conductor of the sheathed power cable 50.

A leak current flows directly between the surface of the sheathing material of this cable and the ground, thereby forming a leak resistor R12 of the leak current.

When the voltage measuring apparatus 600 is suspended on the sheathed power cable 50, coupling capacitance Cc between the voltage measuring apparatus 600 and sheathing material of the sheathed power cable 50, parasitic capacitance Cs between voltage measuring apparatus 600 and ground, and the leak resistor R11 of the leak current flowing from the surface of the enclosure constituting the sensor to the ground are formed on this voltage measuring system.

The following shows the values for parasitic capacitance Cs and the coupling capacitance Cc on the sheathed portion: Since the voltage measuring apparatus 600 is located at a position as high as several meters above the ground, the parasitic capacitance Cs is set at a value as small as 1 pF. In the meantime, the coupling capacitance Cc is set to a value as large as 100 pF since it is formed by placing the electrode (the first conductive member) having a length of a few tens of cm in close contact with the sheathed power cable 50, as will be explained later. In other words, it is set so that the following relationship is gained; parasitic capacitance Cs<<coupling capacitance Cc. So the potential on the surface of the sheathing material of the sheathed power cable and on the joint a (actually, capacitance) of the voltage measuring apparatus is almost the same as the power cable voltage.

This voltage measuring apparatus 600 comprises a current voltage converting means 100 connected between the capacitance 11 and capacitance 12, and a voltage value calculating means (not illustrated) to be explained later.

The current voltage converting means 100 and other arrangements will be described later.

When a high-voltage commercial frequency a.c. voltage V1 is applied to the sheathed power cable 50, current ics flows to the current voltage converting means 100. Using the commercial frequency impedance Zcs of the parasitic capacitance Cs, it can be expressed as follows:

$$ics = V1/Zcs \quad (1)$$

Zcs takes a certain impedance value according to the conditions in which the voltage measuring apparatus is installed. So Zcs is set in advance so that ics is proportional to V1.

The influence of the leak resistors R11 and R12 will be described below:

The value of leak current ics is small (ics≈1.2 μA if voltage to ground of V1 is 6.6 kV/√3, Cs is 1 pF) and the internal resistance of the current voltage converting means 100 is set normally at a lower valve, so the potential difference at an end point a≧b is negligibly small. This makes it possible to ignored the influence of the leak resistors R11 on the surface of the voltage measuring apparatus enclosure, and only the influence of leak resistor R12 must be taken into account.

For the leak resistor R12, the coupling capacitance Cc and parasitic capacitance Cs are placed in parallel, and the influence of leakage is determined by Cc since Cc>>Cs. The voltage dividing point as a conventional voltage divider of small capacitance sensitive to the leakage will be lost. In addition, the value of coupling capacitance Cc is not subject to the restriction in the designing of voltage division ratio, as in the prior art example. The value can be increased to several scores of times or even more. So the influence of leakage can be reduced by the corresponding amount. Further, the output depends on the impedance of one parasitic capacitance where the atmosphere is assumed as an dielectric. It is not particularly affected by the temperature, when compared with the temperature characteristics of the voltage divider of multiple capacitances having different types of dielectrics, as in the conventional method.

For the reasons discussed above, the present invention provides high precision with a simple circuit.

Figure 3:
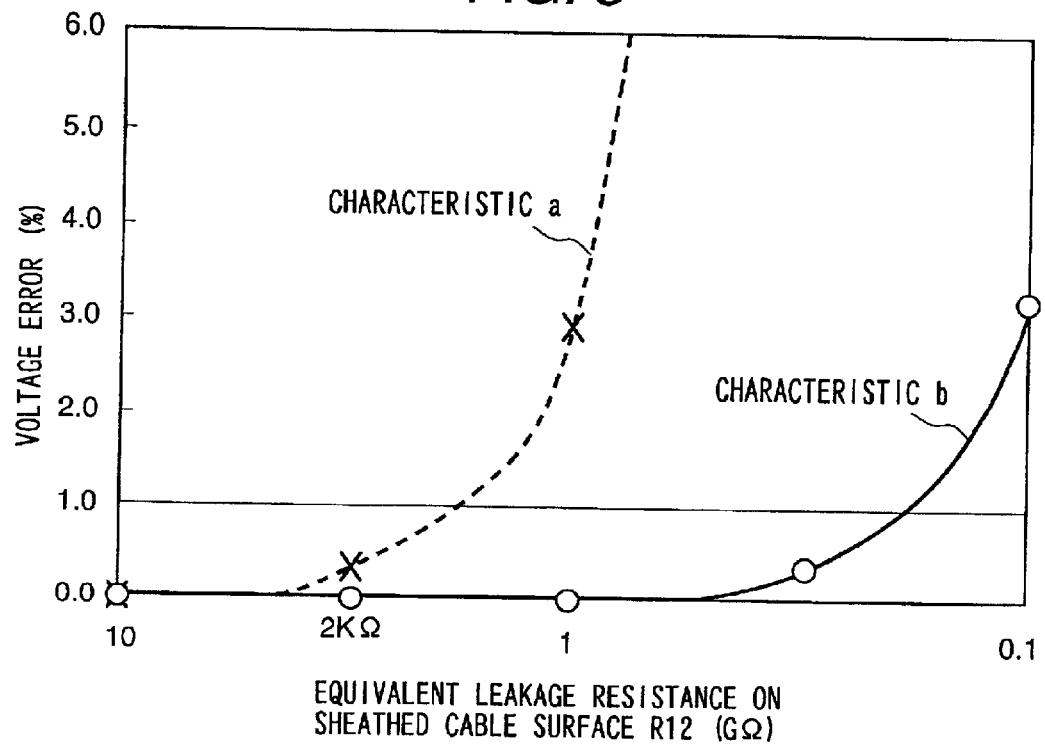
FIG. 3 is a diagram showing comparison of characteristics between the present invention and prior art regarding changes in equivalent leak resistor on the surface of the sheathed power cable.

The following will clarify the difference between the present invention and prior art examples using specified calculations:

FIG. 3 illustrates the result of calculating the error depending on the change of the leak resistor R12(deviation between voltage measuring apparatus measured value and true value).

Figure 12:
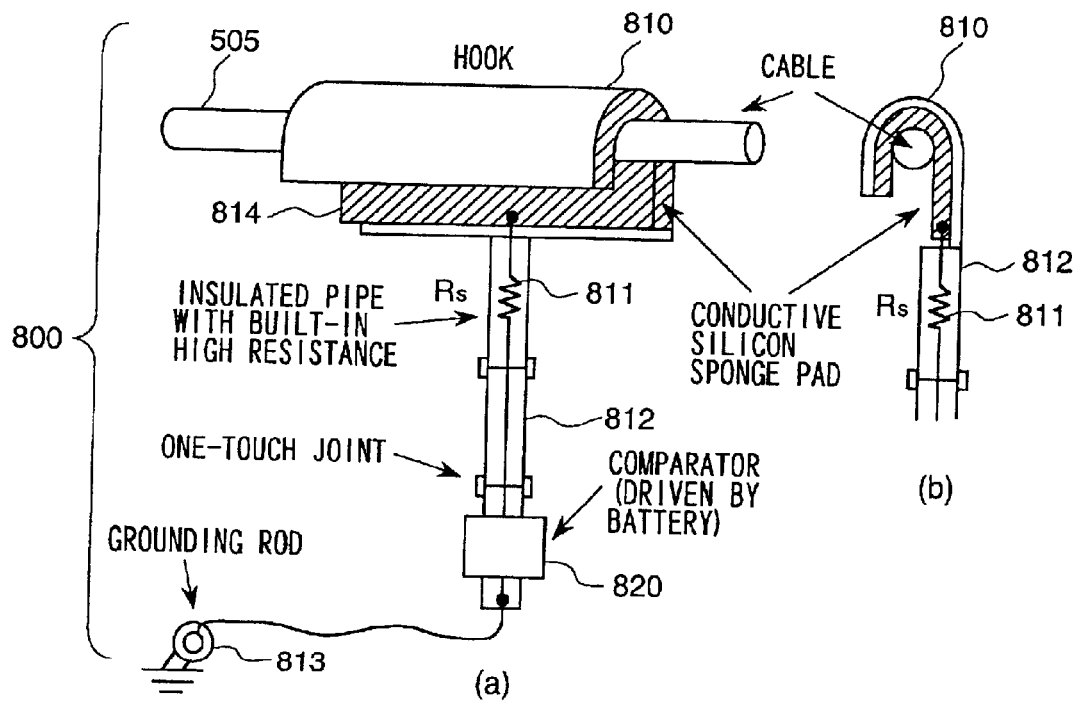
FIG. 12 is a diagram representing the arrangement of an embodiment of the calibrator 800 according to the present invention used for calibration at the site where a voltage measuring apparatus is installed.

Characteristic "a" relates to the prior art capacitance voltage dividing method as shown in FIG. 12 on the assumption that voltage-divided capacitance Cd is 10 pF and coupling capacitance Cc is 10 pF.

Characteristic "b" relates to the method according to the present invention on the assumption that coupling capacitance Cc is 100 pF. Further, for both "a" and "b", calculation is based on the following condition: Parasitic capacitance Cs is 1, leak resistor 11 is 1 GΩ, and voltage to ground V1 of the power cable is the equivalent value at a rated phase and voltage 3810V (6.6 kV/√3).

For characteristic "a", an error of 1% or more of the rated voltage (38.1 volts) is produced if leak resistor R12 is reduced below about 2 GΩ. For characteristic "b", an error can be kept below 1% even if leak resistor R12 is reduced below about 0.2 GΩ. This shows that, according to the present invention, the influence of the change of the leak resistor R12 can be reduced ten times or more when compared with the conventional method.

Figure 4:
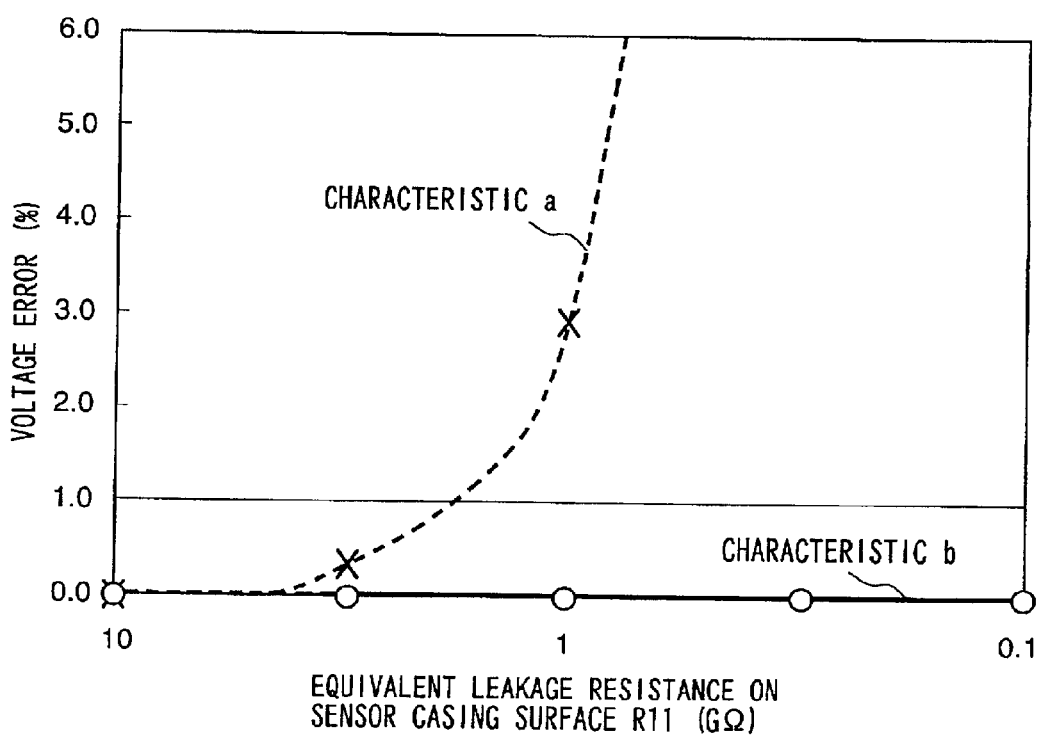
FIG. 4 is a diagram showing comparison of characteristics between the present invention and prior art regarding changes in equivalent leak resistor on the surface of the voltage measuring apparatus enclosure.

FIG. 4 shows the influence of leak resistor R11:

The leak resistor R12 used as a parameter in FIG. 3 is fixed at 10 GΩ, and the other conditions are the same as those in FIG. 3.

For characteristic "a", an error of 1% or more of the rated voltage (38.1 volts)is produced if leak resistor R11 is reduced below about 2 GΩ. By contrast, according to the present invention, current voltage converting means 100 is equivalently in the low impedance, as shown in characteristic "b". Accordingly, it does not depend on the value of resistor R11. An error caused by leak resistor R11 does not occur in terms of principle.

Figure 5A:
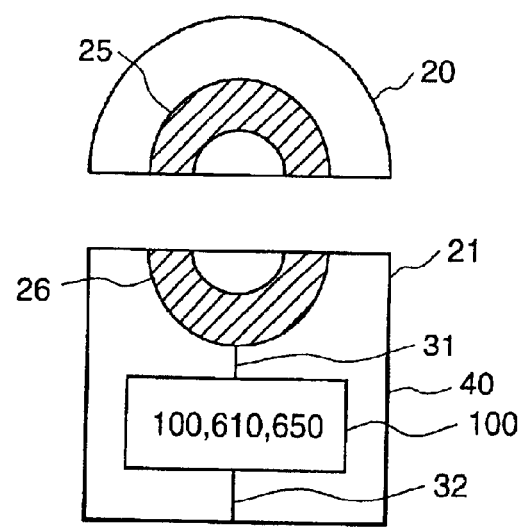
FIGS. 5(a) and 5(b) hire diagrams representing the embodiment of an ammeter circuit used in the present invention.
Figure 5B:
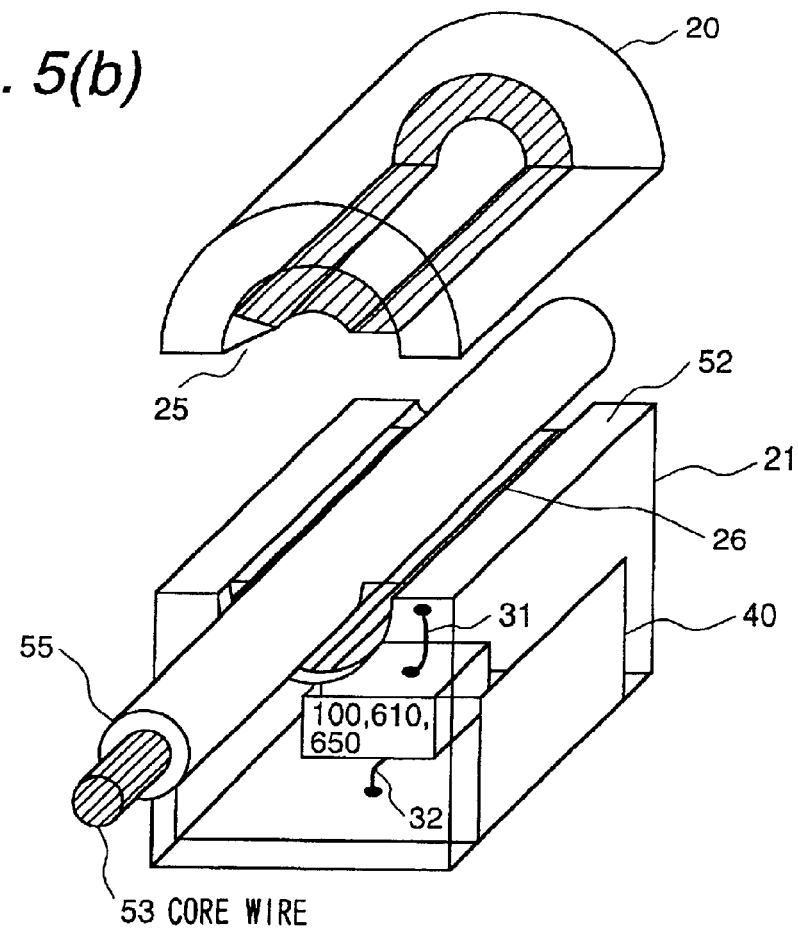

The following shows the entire configuration of the voltage measuring apparatus 600 with reference to FIG. 5:

FIG. 5(a) is a vertical cross sectional view and FIG. 5(b) is a transverse cross sectional view when the apparatus is mounted on the sheathed power cable. The voltage measuring apparatus 600 comprises enclosures 20 and 21, conductive members 25 and 26, metallic conductive plate 40, current voltage converting means 100, voltage measuring apparatus 600, microcomputer 650 and radio transmitter-receiver 610. The current voltage converting means 100, voltage measuring apparatus 600, microcomputer 650, and radio transmitter-receiver 610 will be described in details, so they will be omitted below.

The enclosure of the voltage measuring apparatus 600 is designed in a double-split structure to permit a hot line install on the power cable. For this connection, use of a hinge and catch is preferred to improve installation efficiency. This catch is intended to avoid electric shock coming from the power cable where voltage is applied when the voltage measuring apparatus for sheathed power cable is installed outdoors for a long time. So it is preferred to be made of plastic or stainless steel immune to corrosion or current application. In this embodiment, it is composed of an upper enclosure 20 and lower enclosure 21.

The upper enclosure is designed in a semi-cylindrical insulator made of resin, and its inside is lined with semi-cylindrical conductive member 25. As shown in FIG. 5(b), at least on one end of this enclosure 20 and/or 21 is projected from the conductive member 25 and/or 26 almost in parallel with the sheathed power cable. This projection protect the personnel engaged in installation work against electric shock.

Similarly, the lower enclosure 21 is semi-cylindrical on the upper portion, and is an insulator made of resin. Its interior is lined with a conductive member 26.

Figure 6:
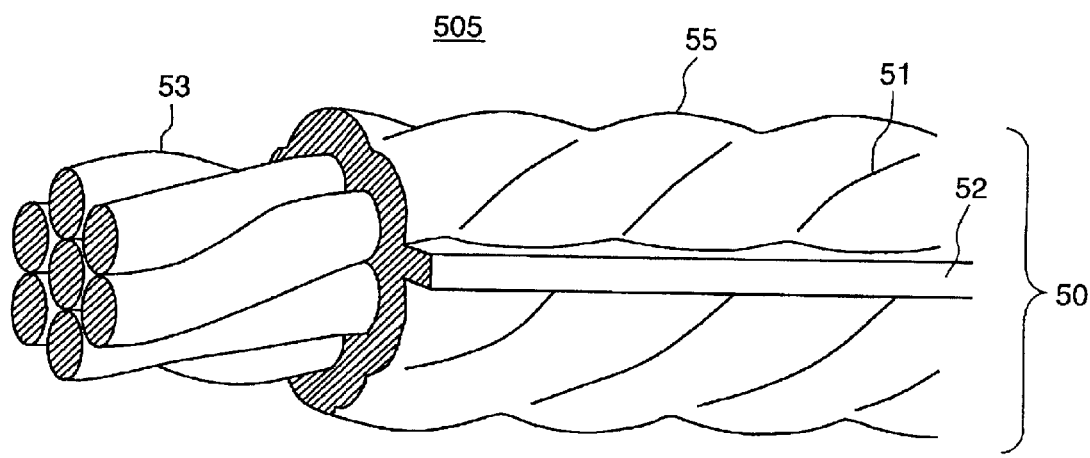
FIG. 6 is a diagram representing the enclosure installation structure as one preferred embodiment of the present invention including a coupling means.
Figure 8:
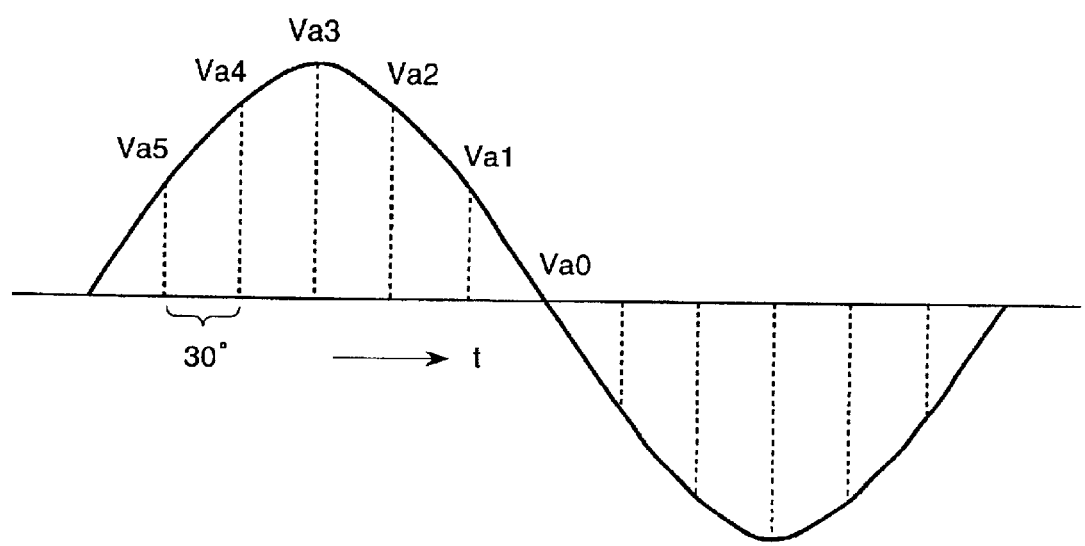
FIG. 8 is a circuit diagram of the voltage measuring apparatus using the radio interface according to the present invention.

These conductive members 25 and 26 are made of silicone sponge containing carbon. Use of silicone improves durability, and use of rubber in a sponge form improves close adhesion with the sheathed portion 55 wound around the cable conductor 53 of the sheathed power cable 50, thereby ensuring stable formation of coupling capacitance Cc between this conductive member and cable conductor. This is due to the fact that the surface of the sheathed power cable is not truly round, and stranded wire formed portion 51 and ice/snow deposition preventive protrusion 52 are provided, as shown in the cross sectional view of the sheathed power cable in FIG. 6. Accordingly, to ensure a close adhesion to the stranded wire formed portion 51, at least one of these conductive members 25 and 26 is designed in the form of a stranded wire. Then close adhesion is improved.

These conductive members are preferred to be softer than 20 in terms of Shore hardness. This embodiment uses the silicone sponge with carbon having a resistivity of 5th power of 10 Ωcm. The thickness of the silicone sponge is preferred to be reduced about 20% when compressed for bonding. So its thickness contains this amount to be reduced by compression.

The conductive member is formed to surround the sheathing material and to have a certain length in the direction almost parallel to the power cable. This arrangement protects the structure held inside against magnetism, electric field and electromagnetic wave caused by power cable, and ensures a high precision in the measurement of this voltage.

Further, a metallic conductive plate 40 made of metallic conductive member is provided on the bottom and side of the inner wall surface of the lower enclosure 21 so as to surround the current voltage converting means 100, microcomputer 650 and radio transmitter-receiver 610. Installation of the metallic conductive plate 40s to surround the current voltage converting means provides the function of a guard electrode for protection against the magnetism, electric field and electromagnetic wave coming from the power cable, as well as electric field of surrounding surge including lightning surge. At the same time, it provides the function of generating parasitic capacitance Cs to the ground.

The conductive member 25 or 26 are connected to the terminal 111 on the side of the negative input of the operational amplifier 110 inside the current voltage converting means to be described later 100 through the conductor 31. The metallic conductive plate 40 is connected to the terminal 112 on the positive input side of the operational amplifier 110 through the conductor 32.

The enclosure arranged in this configuration is connected to the power cable 50 comprising a sheathed portion 55 by the upper enclosure 20 and lower enclosure 21, as shown in FIG. 5(b), and multiple screws (not illustrated) are used to fix between both enclosures. When connected, conductive members 25 and 26 are brought in close contact with the sheathed portion 55, and the upper and lower conductive rubbers are brought in contact to be connected with each other.

Figure 7:
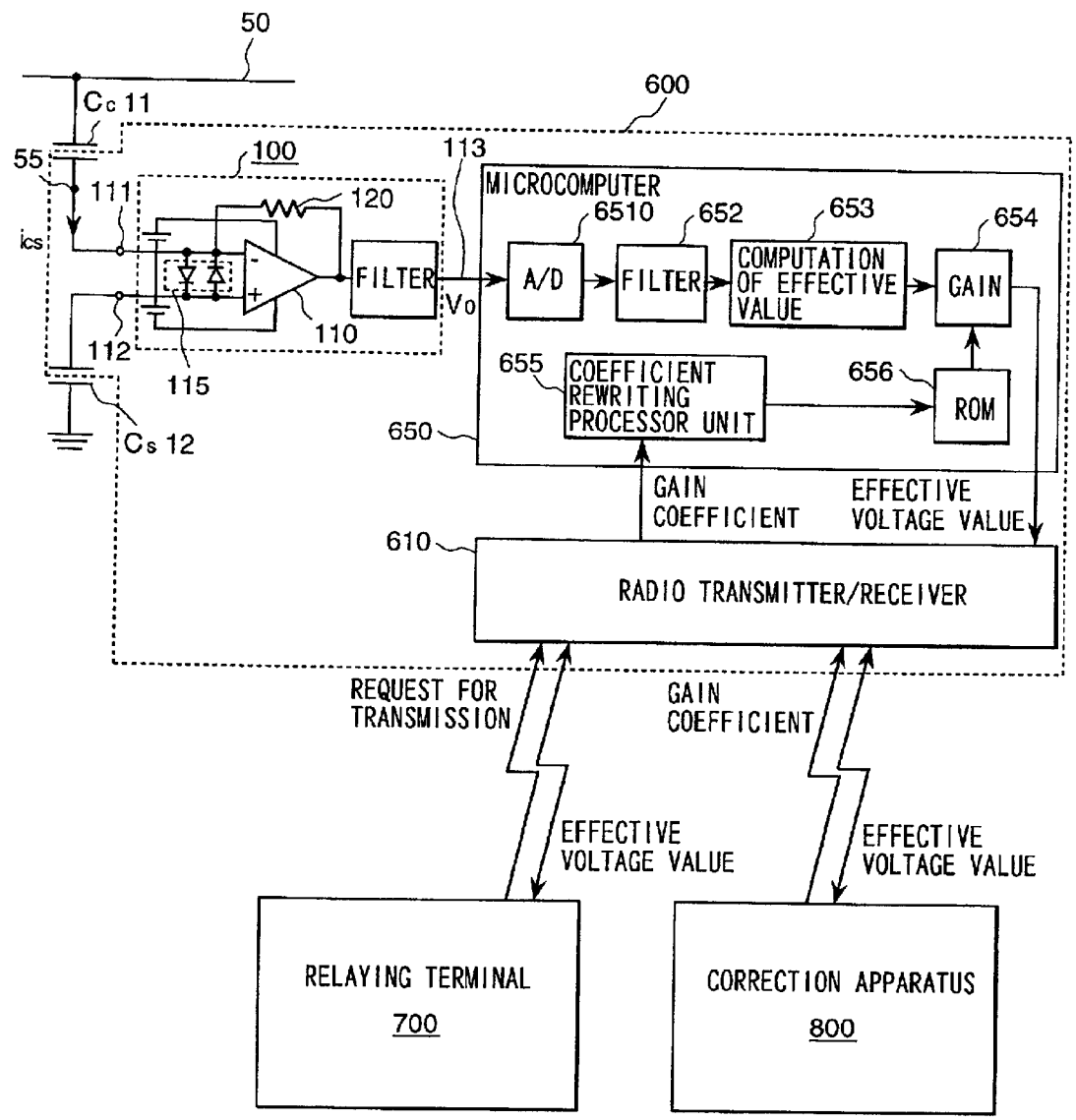
FIG. 7 is a diagram representing one example of the sheathed power cable.

With reference to FIG. 7, the following shows the block diagram of the voltage measuring system including the detailed block diagram of the voltage measuring apparatus 600:

The current voltage converting means 100 comprises a CMOS operational amplifier 110 of high input impedance, negative feedback resistor 120, and diode 115 connected antiparallel between between the input terminals 111 and 112.

When the leak current ics substantially determined by parasitic capacitance Cs, coupling capacitance Cc and power cable voltage V1 flows to the terminal 111 on the input side of the operational amplifier 110, it is negative-fed back to the input terminal 111 from the output terminal 113 of the operational amplifier 110 through the feedback resistor 120, and voltages of the terminals 111 and 112 on the input side of the operational amplifier 110 become equal with each other. In this case, output voltage Vo of the terminal 113 on the output of the operational amplifier 110 is expressed by Vo=Vo=ics. Rf. Then a. c. voltage waveform proportional to leak current (alternating current) ics is obtained where the resistance value Rf is assumed as a conversion coefficient. This a.c. voltage waveform is sampled by the microcomputer 650, and is subjected to A/D conversion. The data string is then subjected to computation of the root-mean-square value to notify the voltage value (value for voltage to ground) V1 applied to the cable conductor 53 of the sheathed power cable 50. Since the range of leak current ics is from 1 to several microamperes, feedback resistor Rf is set to about 1 megohm.

Such a circuit arrangement ensures excellent temperature characteristic, and compatibility between high precision and low consumption power since conversion impedance is provided by only one resistor.

SUMMARY OF THE INVENTION
(Problems to be Solved by the Invention)

This arrangement consists of a relaying terminal 700 for receiving measurement data from one or more than one voltage measuring apparatus by radio and a calibrator 800 for accurate setting of the output of the voltage measuring apparatus through radio equipment.

The voltage measuring apparatus 600 comprises a current voltage converting means 100 by the operational amplifier 110 inserted in series into the coupling capacitance 11 and parasitic capacitance 12, microprocessor (hereinafter referred to as "microcomputer") 650, and radio transmitter-receiver 610. The output of the current voltage converting means 100 is input and connected to the built-in A/D (analog-digital) converter 651 of the microcomputer 650. Further, output from the A/D converter 651 enters the root-mean-square value computing circuit 653 through digital filter 652, and enters the radio equipment 610 through the gain coefficient circuit 654. The microcomputer 650 contains a coefficient rewriting circuit 655 and a ROM656 rewritten by its control signal. The function of the gain coefficient circuit 654 is to multiply the coefficient values for the output signal of the root-mean-square value computing circuit 653 and the ROM 656.

The operation of the above-mentioned arrangement depends on the voltage V1 of the power cable 50. The current ics flowing to the parasitic capacitance is converted into the a.c. voltage V0 by means of current voltage converting means 100, and is output to the output terminal 113. The Vθ is loaded into the microcomputer 650 through the A/D converter 651. After that, the fundamental wave component is extracted by the filter 652.

In the root-mean-square value computing circuit 653, the root-mean-square value is found for a.c. voltage waveform of the filter 652 using a binary addition method where computation is comparatively easy. The following shows the root-mean-square value calculating procedure by binary addition method, with reference to voltage waveform chart in FIG. 9:

(1) Sample six points of amplitude data from Va0 to Va5 for every 30 degrees of electrical angle.

(2) Find out the sum of absolute value for two data 90 degrees separated from each other (Vx0 to Vx2).

$$Vxn=|Van!+|Va(n+3)| \ (n=0 \text{ to } 2)$$

(3) Find out half the absolute value for the difference of the absolute values for two data 90 degrees separated from each other (Vy0 to Vy2).

$$Vyn=(\tfrac{1}{2})||Van|-|Va(n+3)||(\text{where } n=0 \text{ to } 2)$$

(4) Subtract (3) from (2).

$$Vn=Vxn-Vyn(n=0 \text{ to } 20)$$

Figure 9:
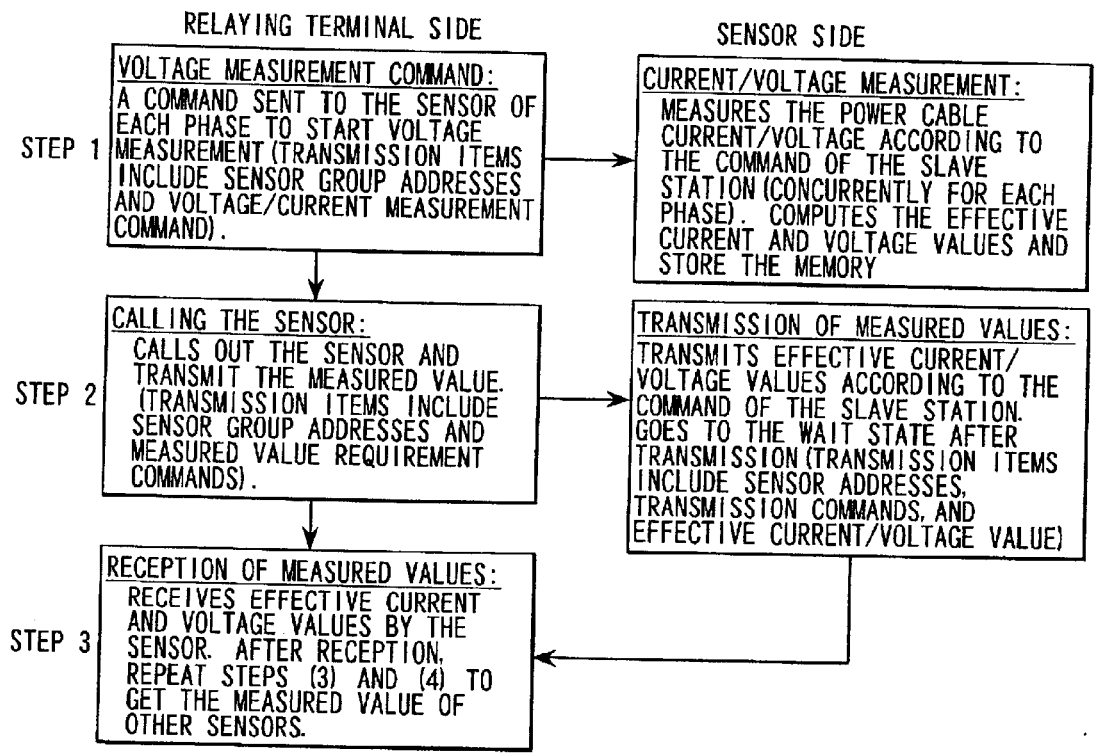
FIG. 9 is a diagram illustrating the root-mean-square value calculating procedure by binary addition method.

(5) Find out the sum of the Vn calculated in step (4), and multiply it by coefficient k. Then the root-mean-square value V rms of the waveform shown in FIG. 9 is obtained.

$$V \text{ rms}=k(V0+V1+V2)$$

The root-mean-square value obtained in this way is multiplied by the gain coefficient set by the coefficient ROM656. The result of multiplication is sent as the voltage root-mean-square value of the power cable conductor to the radio transmitter-receiver 610 from the gain coefficient circuit 654.

Figure 10:
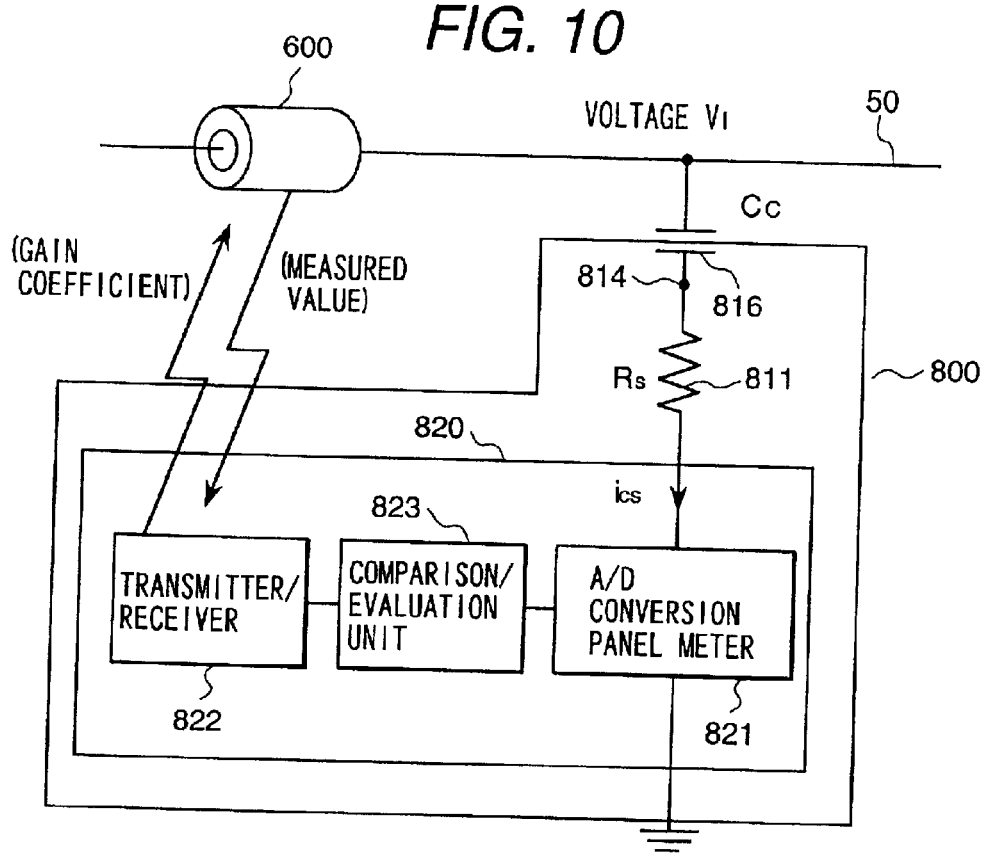
FIG. 10 is a diagram representing radio interface processing steps between the voltage measuring apparatus and relaying terminal 700, and details of processing.

The voltage measuring apparatus 600 carries out communications with the relaying terminal 700 and calibrator 800 through the radio transmitter-receiver 610. FIG. 10 shows an embodiment of the radio interface processing step between the voltage measuring apparatus and relaying terminal 700 and the details of processing. The relaying terminal 700 sends to the voltage measuring apparatus 600 the signal to request measured values. In response to this request, the voltage measuring apparatus 600 sends the measured value to the relaying terminal 700. Through this step, the relaying terminal 700 can get information on the voltage of the power cable measured by the voltage measuring apparatus 600.

The to-ground parasitic capacitance of the voltage measuring apparatus using the to-ground parasitic capacitance of the power cable suspension type power distribution voltage measuring apparatus itself differs depending on the presence or absence of a adjacent power cable and building or installation environment of the voltage measuring apparatus. So voltage measuring apparatus according to the present invention provides a calibrating means for an installation site to ensure improved precision.

Figure 11:
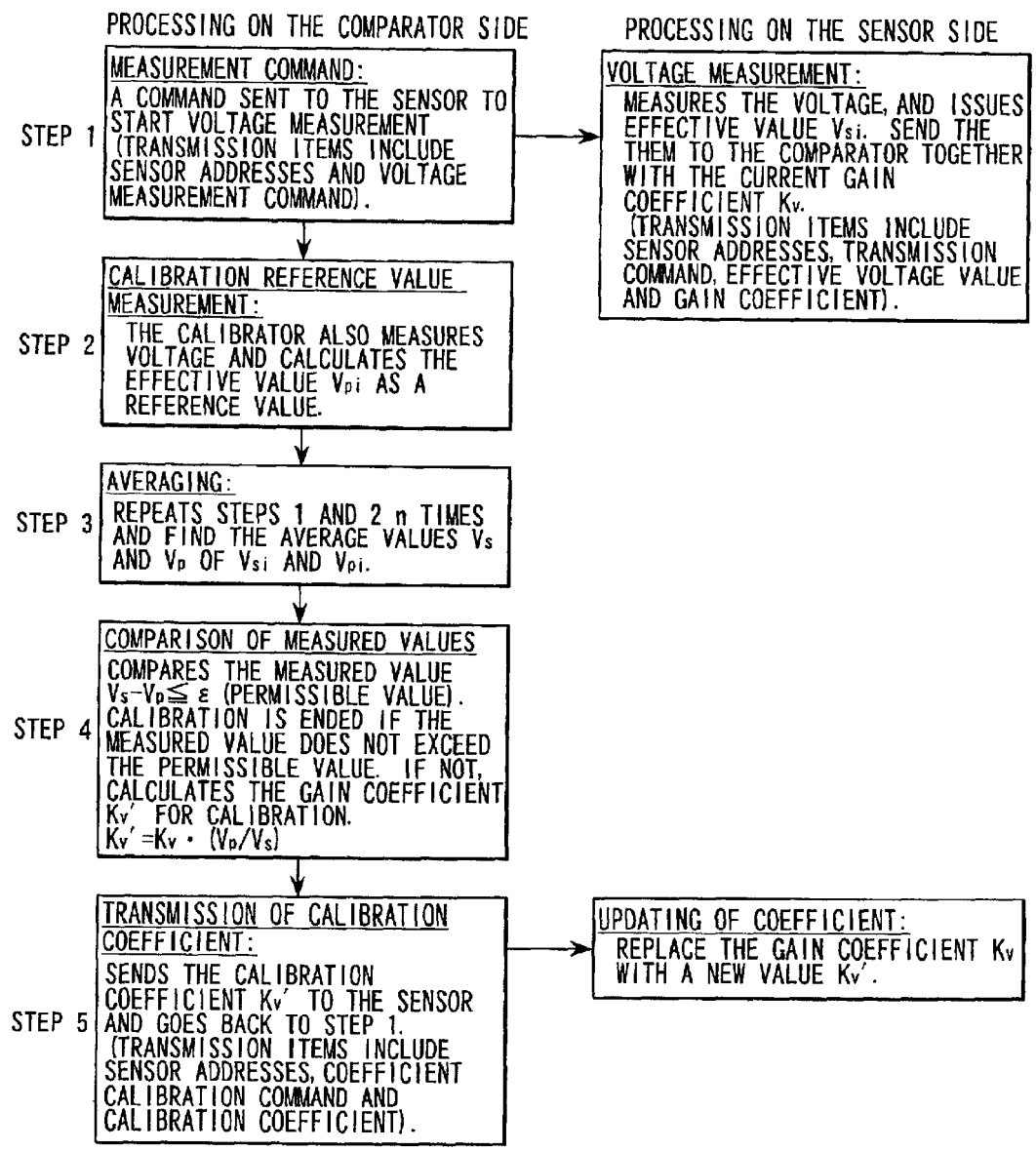
FIG. 11 is a diagram representing radio interface processing steps between the calibrator 800 and voltage measuring apparatus 600, and details of processing.

FIG. 11 is a circuit block diagram representing an embodiment of the on-site calibrator of the voltage measuring apparatus of the present invention. The calibrator 800 consists of a coupling capacitance 816 for power cable 50, high-resistance resistor 811 and calibration circuit 820. The calibration circuit 820 comprises an A/D conversion panel metal 821 which measures the root-mean-square voltage by terminating the influent current ics with resistor, transmitter-receiver 822 for exchanging data with voltage measuring apparatus 600 by radio, and comparison/evaluation unit 823 for comparing and evaluating the received data and panel meter value. Here the coupling capacitance 816 is obtained through the power cable sheath, similarly to the voltage measuring apparatus 600. Coupling capacitance is set at several hundred pF. The high-resistance resistor 811 is set to about 3GR. Accordingly, the flowing current ics is determined by the high-quality high-resistance resistor 811, and is very little affected by the coupling capacitance 816. To eliminate the influence of the coupling capacitance completely, the value on the input terminal resistor of the panel meter 821 is adjusted and calibrated in advance to ensure that the output of the A/D converter panel meter 821 will reach a specified value at the rated voltage whenever required.

The arrangement explained above allows the calibrator 80 to compare between the reference measurement voltage of the A/D conversion panel meter 821 and the measured value of the voltage measuring apparatus 600 through the transmitter-receiver 822. The calibrator sends the gain coefficient to be changed to the voltage measuring apparatus 600 to ensure agreement between them. Radio loopback is repeated until both values come within the tolerance (for example, within ±0.5%).

When the above steps are taken, a high precision of the A/D conversion panel meter 821 can be ensured in the voltage measuring apparatus 600, despite the environment at the installation site. Both the calibrator 800 and voltage measuring apparatus 600 perform operations at a low current on the same order. So similar characteristics or a kind of differential effect can be expected for anticipated disturbances. Further, Current ics flowing to the calibrator 800 is as small as 1 microampere, so the ground resistor of the calibrator 80 is permissible up to 10 megohms. This has an advantage of permitting easy grounding.

FIG. 12 represents an embodiment of the radio interface processing step between the calibrator 800 and voltage measuring apparatus 600, and the details of processing. The calibrator 800 receives the measured power cable voltage V1 from the voltage measuring apparatus 600, calculates the gain coefficient based on this value to send the result of calculation to the voltage measuring apparatus 600. The gain coefficient received at the radio transmitter-receiver 610 of the voltage measuring apparatus 600 is stored in the coefficient ROM656 by the control signal of the coefficient rewriting circuit 655. A series of calibration steps are now completed.

As described above, the voltage measuring apparatus of the present invention is mainly based on software processing of the microcomputer. This permits flexible and reliable modification of characteristics, and allows all circuits to be operated from a single 5-volt power source. Further, the radio transmitter-receiver is used for signal interface with the outside. This ensures a high resistance to adverse environmental conditions. For example, when compared with an optical fiber cable, there is no leakage through the cable surface, and a high resistance to electric field surge is provided. Moreover, accurate automatic calibration is possible in conformity to the environment at the installation site of voltage measuring apparatus. So high measuring accuracy is ensured at all times without depending on the installation conditions. For the same reason, the present invention easily copes with a long-term secular change including the environment on the side of the voltage measuring apparatus, thereby ensuring economical operation.

Figure 13:
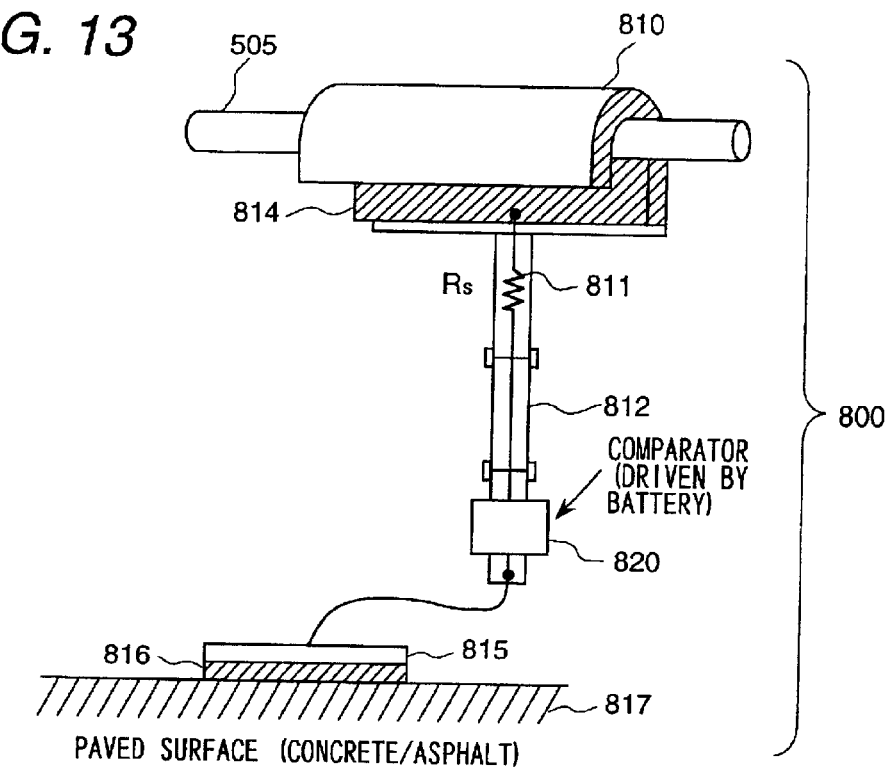
FIG. 13 is a diagram representing an embodiment of a calibrator grounding means.

FIG. 13 is a schematic diagram representing an embodiment of calibrator 800 according to the present invention used for calibration at the site where the voltage measuring apparatus is installed. The calibrator 800 comprises a hook 810 lined with a conductive sponge 814 for capacitance coupling between the sheathed power cable 505 and calibrator 800, an insulated pipe 812 containing a built-in high-resistance resistor 811 supporting the hook 810 and connected to the conductive sponge 814, battery-operated calibrator 820 and ground circuit 813. The insulated pipe 812 is made of multiple fiberglass reinforced plastics (FRP) having joints. The high-resistance resistor 811 is built in the first pipe supporting the hook 810 to ensure safety.

To get the maximum possible coupling capacitance, the calibrator 800 is designed in such a way that the width of the hook is greater than that of the voltage measuring apparatus. For example, it is designed to have a width of about 50 cm, and the conductive rubber pad 814 with lining is made of the material softer than the conductive rubber pad of the voltage measuring apparatus in such a way that it can be brought into close adhesion with the power cable 505 at a small pressure.

The arrangement and operation of the calibrator circuit 820 are the same as those showing in FIG. 11, so their description will be omitted.

The calibrator 800 can be used in two different ways at the site where the voltage measuring apparatus is installed. One way is that the apparatus is operated on a working vehicle when the voltage measuring apparatus is installed. In this case, the entire pipe can be short. Another way is that the apparatus is operated manually on the ground when a vehicle is not used. The entire pipe must be long enough with a joint used at a distance of about 10 cm. Accordingly, the pipe must be light in weight and can be easily handled in order to ensure that it can be operated by one person. The FRP pipe diameter of the FRP is preferred to be 45 mm with a wall thickness of about 1.5 to 2 mm. To reduced the weight, the calibrator 820 including the battery 820 may be separated from the pipe and installed on the ground. In the calibration step without using a vehicle, the apparatus can be operated by one person and is characterized by a simple structure and economic advantage. So the apparatus can be economically used when there is a change in the environment where the voltage measuring apparatus is installed, for example, when a structure or a new building is constructed or removed close to the voltage measuring apparatus. It can also be economically used in the periodic calibration every year.

For high-resistance resistor 811, however, induction from other power cables may be possible in the case of complicated wiring. So it is accommodated in one insulated pipe at an intermediate portion sufficiently removed from power cable as a source of induction.

Figure 14:
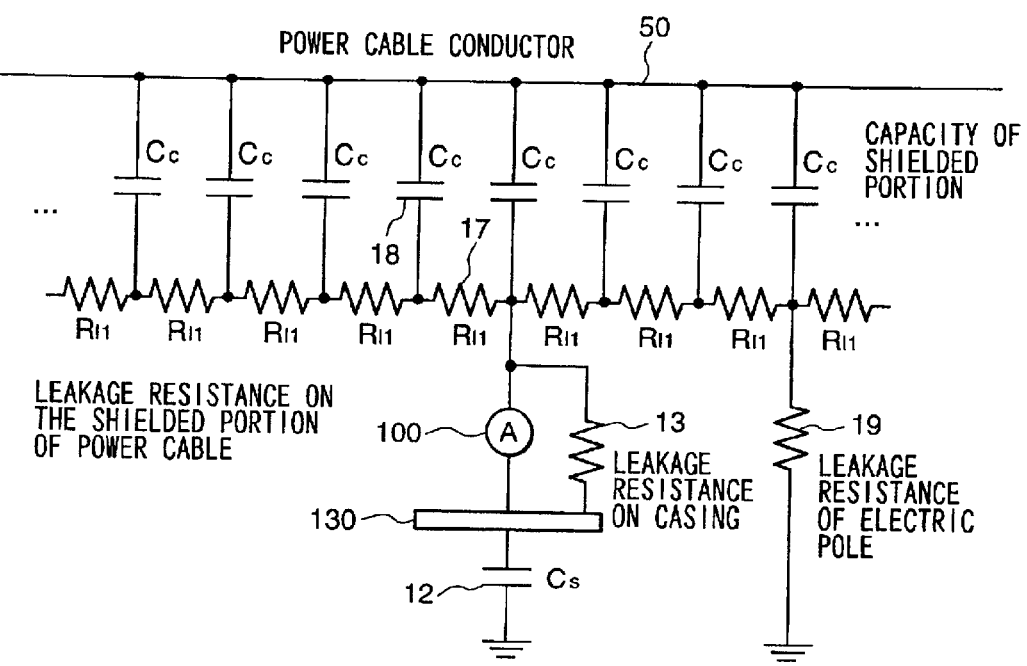
FIG. 14 is a block diagram representing an embodiment of a calibrator at the installation site of the voltage measuring apparatus according to the present invention.

The calibrator measures power cable voltage from the ground. So grounding as a voltage reference and grounding for safety are necessary. However, power cables are often routed in a urban district, and many of the routes are paved with concrete and asphalt without any grounding terminal nearby. FIG. 14 shows an embodiment of a grounding means for such cases.

In the calibrator given in FIG. 14, a soft conductive rubber pad 816 is provided on the tip of the grounding wire connected to the calibrator circuit 820 through the metallic plate 815 so that it is brought in contact with the concrete surface. The contact area is 30 cm square.

In the arrangement described above, water is sprinkled over the surface in contact with concrete before grounding, and the conductive rubber pad 816 is brought in contact. Then grounding work is performed. As will be explained later, the ground current of the calibrator is about 1 microampere, and the power cable voltage to the ground is as high as 3.8 kV (=6.6 kV/√3). If the permissible ground voltage is about 10 volts, grounding resistor of about 10 megohms is sufficient. Accordingly, such a high grounding resistance can be easily achieved by the method given in FIG. 13. This facilitates the use of the calibrator even if there is no exposed surface of the ground. The effective ground area for the voltage measuring apparatus is sufficiently large for the calibrator installation area. So there is no problem at all.

Figure 15:
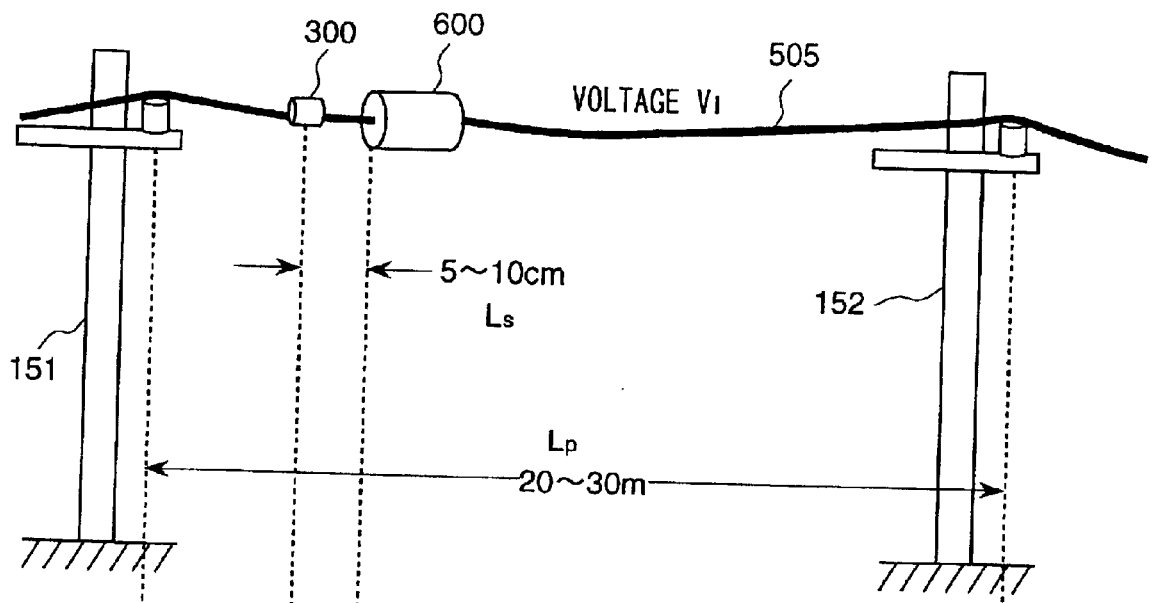
FIG. 15 is an equivalent circuit diagram representing when the voltage measuring apparatus of the present invention is installed on the power cable.
Figure 15:
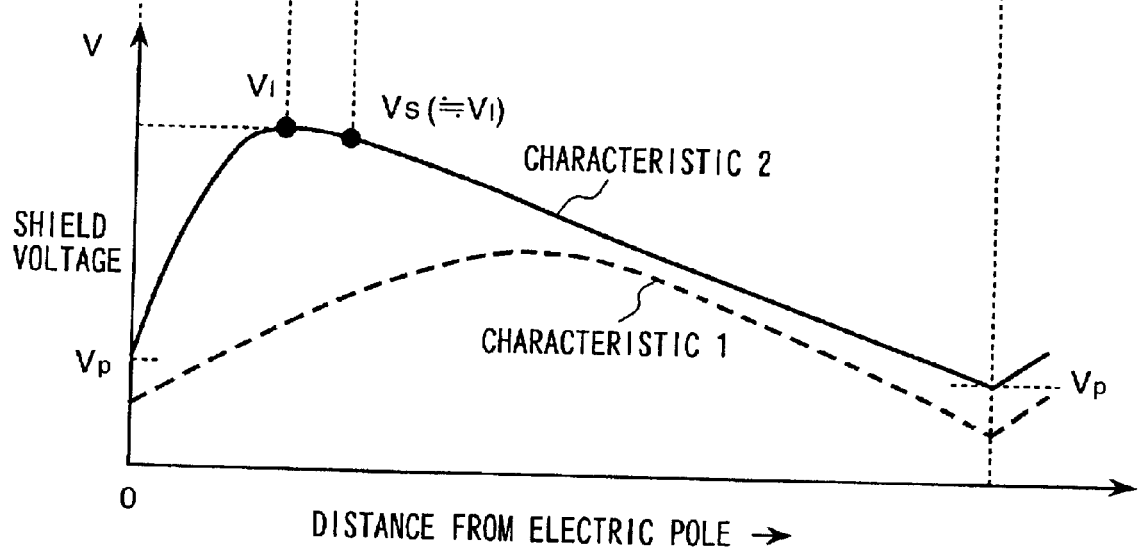

As described above, voltage measurement of the sheathed power cable is characterized by indirect measurement where power cable potential is measured via shield capacitance. Its equivalent circuit is shown in FIG. 15. On the assumption that the shield capacitance per unit length of the power cable is Ccc and surface leak resistor per unit length is R11, the surface potential can be expressed by the ladder type equivalent circuit where shield capacitance is pulled up toward the power cable potential by the impedance of Ccc, and surface leak resistance is pulled down toward the ground potential by the R11. Accordingly, the present invention allowing an increase of shield capacitance Cc can be said to be highly resistant to reduction in the surface leak resistor R11, but it still depends on the surface potential. More flexible measures are taken when there is an increase in surface leakage, for example, when the power cable is exposed to salt damage and there is a substantial reduction in leak resistance.

Figure 16:
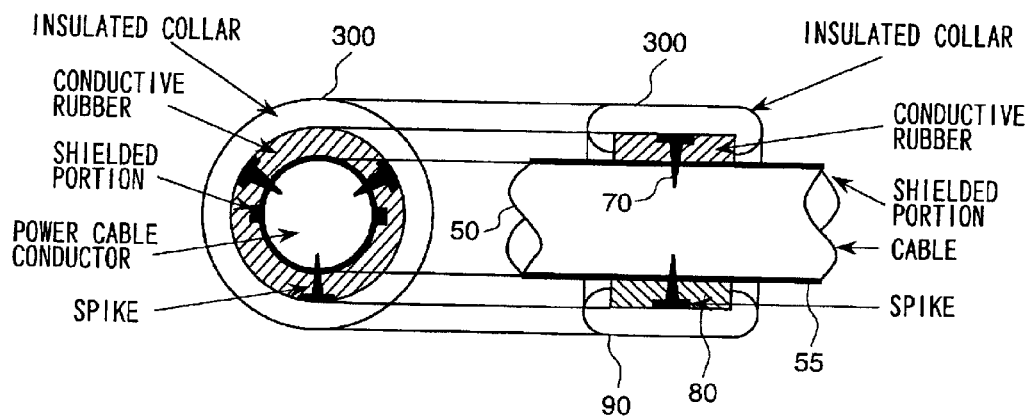
FIG. 16 is a schematic diagram representing the relationship of sheath potential corresponding to the distance of the power cable between electric poles when there is a big leak.

FIGS. 16(a) and (b) show another embodiment of the present invention. It shows the relationship between electric poles of the power cable and shield potential when there is a big surface leakage. FIG. 16(a) shows one electric pole section of the power cable. The power cable 505 is fixed by porcelain insulators of electric poles 151 and 152. As described above, the surface potential of the sheathed power cable can be expressed by the ladder type equivalent circuit where it is pulled up toward the power cable voltage by the shield capacitance per unit length of the power cable and is pulled down toward the potential of installation site by the leak resistor per unit length. So when the electric pole including porcelain insulator is assumed as a return circuit for leak current to go back to the ground and the parasitic capacitance of load on the voltage measuring apparatus is ignored, the surface potential of the shield power cable can be represented by the voltage characteristic 1 of FIG. 16(b), with respect to the distance from the electric pole. In other words, the surface potential is the highest at the intermediate point of the electric poles, but a substantial reduction with respect to power cable voltage cannot be avoided if there is big leakage.

Accordingly, a conductive ring 300 (structure details shown in FIG. 17) is installed as shown in FIG. 16(a) in order to lead power cable voltage to the shield back at a very close distance from the installed power distribution voltage measuring apparatus 200 on the side of the electric pole. As a result, the shield potential at the position where the conductive ring is installed can be made equal to power cable voltage V1.

The voltage characteristic 2 of FIG. 16(b) shows the characteristics when the conductive ring is installed. Namely, surface potential Vs is equal to power cable voltage at the position where the conductive ring is installed. As it is moved further away from the point of installation, it is reduced as shown in voltage characteristic 2.

As shown in FIG. 16(a), let us assume that the distance between conductive ring 300 and voltage measuring apparatus 600 is Ls, distance between electric poles is Lp, power cable voltage is V1, and shield surface potential at the site of electric pole is Vp. Reduction in potential due to leakage is assumed as proportional to the distance. Then potential at the position where the voltage measuring apparatus is installed (voltage detected by voltage measuring apparatus) Vs is expressed as follows:

$$V_s = V_1 - (V_1 - V_p) L_s / L_p \quad (2)$$

Here the error of Vs expressed by the second term of equation (2) is calculated on the assumption that Vp is V½, Ls=10 cm and Lp=20 m. Then the error of 0.25% is obtained. If Vp=0V is assumed as an extreme case, reduction of only 0.5% occurs. Reduction of voltage due to actual leakage is smaller than linear one because of the pull-up effect due to the aforementioned capacitance of the sheathed portion. Accordingly, the error is smaller than the result of tentative calculation in equation (2). In equation (2), voltage precision depends only on the relative installation distance of the voltage measuring apparatus, without depending directly on the magnitude of the surface leak resistance. This is very important. Namely, this means that the present invention shown in FIG. 16($a$) can be effectively applied despite the magnitude of the surface leakage resistance.

When two conductive rings are used and they are installed on both ends of the voltage measuring apparatus, power cable voltage V1 occurs on both ends of the voltage measuring apparatus. So the error can be reduced to zero independently of the distance of the installed voltage measuring apparatus.

Figure 17:
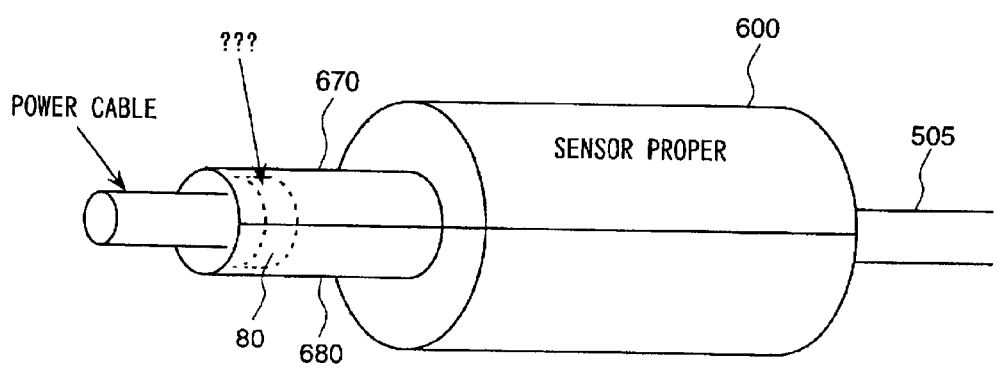
FIG. 17 is a diagram representing a detailed embodiment of a conductive ring.

FIG. 17 shows a detailed embodiment of the conductive ring. In FIG. 17, a ring-formed conductive rubber (sponge) 80 with built-in multiple a thumbtack-formed spike 70 and insulated collar 90 are arranged on a concentric circle with respect to the power cable 50 and sheathed portion 55. Special tools are used to tighten them. Therefore, the spike 70 cuts into the power cable 50, and voltage is applied to the sheathed portion 55 through the conductive rubber 80. The shield surface potential becomes equal to the conductor voltage. The function of the insulated collar 90 is to protect the conductive rubber 80 for improved weatherability and to provide electric insulation. The material used is a resin characterized by excellent weatherability. In execution of the work, the conductive rubber 8 is wound tightly and current flowing through the spike point is very small. So problems such as long-term influence given by rainwater or contact failure are minimized normally. Rubber is attached in the vicinity of the spike point inside the conductive rubber whenever required. This ensures more tight sealing of the spike point and increase contact reliability.

Figure 18:
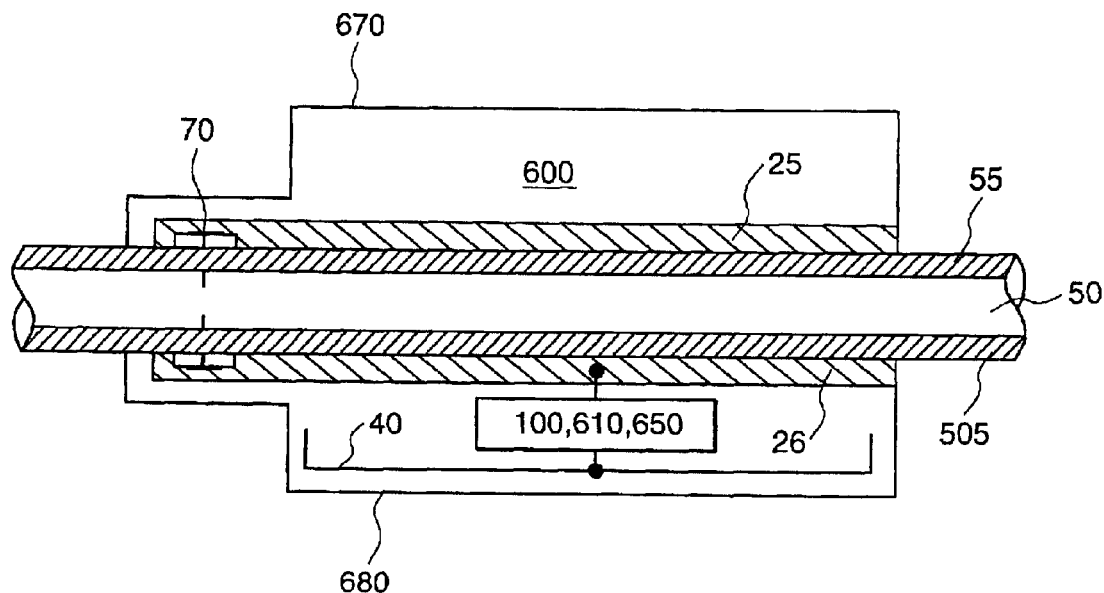
FIG. 18 is another diagram representing a detailed embodiment of a conductive ring.

FIG. 18 shows another embodiment of the present invention.

In FIG. 18, the guard ring 80 based on the ring-formed conductive rubber with built-in thumbtack-formed spike 70 shown in FIG. 17 is provided, as part of the enclosure structure of the voltage measuring apparatus proper, inside the ends of the semi-cylindrical upper insulator 210 split into two and semi-cylindrical lower insulator 220 to fit the voltage measuring apparatus enclosure with the power cable. In this case, the conductive rubber 80 is removed 5 to 10 cm from the end of the electrode connected to the voltage measuring apparatus. In FIG. 18, the ring-formed conductive rubber with built-in thumbtack-formed spike is automatically installed simultaneously when the voltage measuring apparatus is capacitance-coupled to the power cable.

When the embodiment of FIG. 18 is compared with that of FIG. 17, there is no process of installing the conductive ring at the site. This means improved efficiency. Moreover, the insulated collar 90 for the conductive ring can be used as an insulator of the voltage measuring apparatus. This is an economical advantage. However, it is not necessary if leak resistance of the shield portion is sufficiently high and the conductive ring is not required.

Figure 2:
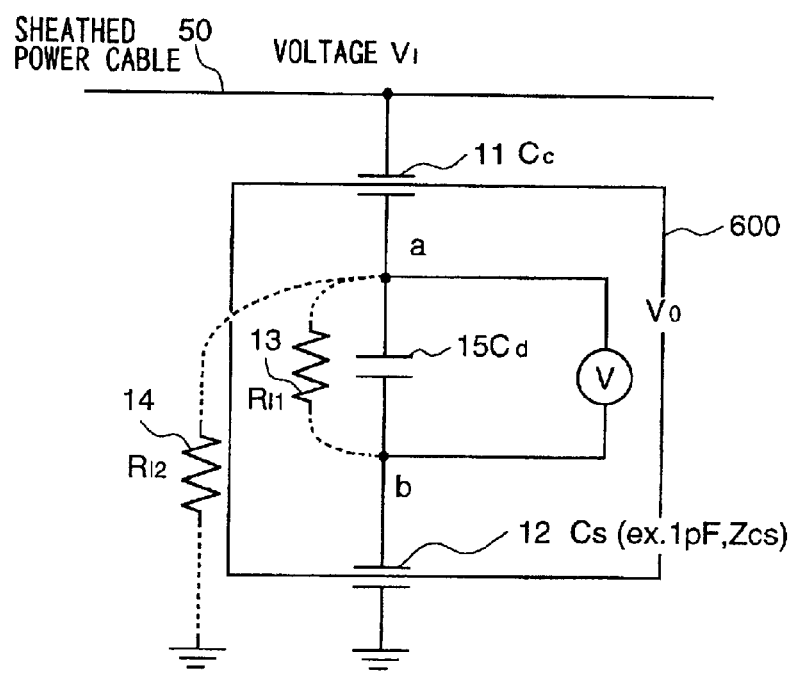
FIG. 2 is a circuit diagram representing the basic principle of a power cable voltage measuring apparatus based on a capacitance voltage divider according to the prior art.

One of the characteristics of the present invention is the relationship of Cc>>Cs between the coupling capacitance Cc with respect to the power cable of the voltage measuring apparatus and the to-ground parasitic capacitance Cs of the voltage measuring apparatus, as shown by the equivalent circuit in FIG. 2. How to increase Cc has been disclosed above. However, to meet requirements of downsizing the voltage measuring apparatus or using a metallic case as the entire voltage measuring apparatus enclosure, more flexible measures must be taken since coupling capacitance Cc tends to increase.

Figure 19:
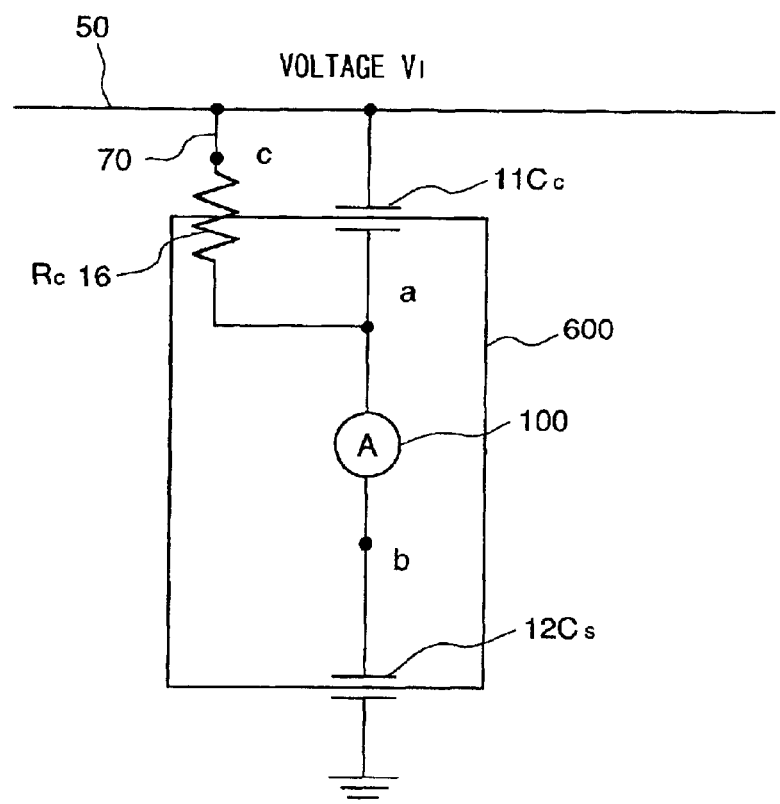
FIG. 19 is a diagram showing an example of the power cable voltage measuring apparatus.

FIG. 19 shows another embodiment of the voltage measuring apparatus 600 according to the present invention. In FIG. 19, the conductive members 25 and 26 split into two for capacitance coupling between the voltage measuring apparatus 600 and the power cable 50 equipped with the sheathed portion 55 are connected with the current voltage converting means 100 almost at the middle position, and one end is connected to the power cable 50 through the thumbtack-formed spike 70.

The equivalent circuit in the arrangement of FIG. 19 becomes as shown in FIG. 20. Namely, the resistor 16 (Rc) by the conductive rubber through the spike 70 is inserted in the current voltage converting means 100 of the voltage measuring apparatus 600, in parallel with the coupling capacitance 11 (Cc) using the conductive members 25 and 26 as electrodes. When the value of resistor 16 is Rc, the value is selected to satisfy the following relationship:

$$CsRc \ll 1/f, \quad V1/Rc < 0.01A$$

This means that parasitic capacitance Cs can be pulled up sufficiently to the commercial frequency voltage, and the current can be limited with sufficient safety, should the voltage measuring apparatus be installed.

A preferred value for resistance value Rc is within the range from 1 to several megohms, for example. This value can be realized by the sponge with carbon having a resistivity of 5th power of 10 $\Omega$.cm disclosed as a preferred resistivity for the conductive rubber of the capacitance-coupled electrode to be brought in close contact with the power cable surface in the embodiment given in FIG. 7.

In the arrangement given in FIGS. 19 and 20, it is important that the current voltage converting means 100 and power cable 50 are connected by the parallel circuit of capacitance 11 and resistor 1. This is due to the following reasons:

(1) Despite some increase in the parasitic capacitance of the voltage measuring apparatus, pulling up of commercial frequency voltage is sufficient without deterioration of precision.

(2) The potential of the voltage measuring apparatus reaches power cable potential through coupling capacitance in face of steep electric field such as lightning surge, thereby ensuring safety.

Current can be limited safely, should the voltage measuring apparatus enclosure be subjected to ground-fault, as explained above.

The present invention improves the measuring precision of the voltage measuring apparatus.

What is claimed is:
1. A voltage measuring apparatus for sheathed power cable comprising:
a first conductive member arranged to contact sheathing material for sheathing a power cable conductor,
a second conductive member for forming a capacitance between ground and itself,
current voltage converting means for converting a current signal flowing between said first conductive member and said second conductive member into a voltage signal having a waveform proportional to said current signal, and
voltage value calculating means for calculating a voltage value applied to said power cable from said voltage signal converted by said current voltage converting means, said voltage value calculating means including:
means for calculating said voltage value from said voltage signal converted by said current voltage converting means, and
a voltage converting gain counting circuit for multiplying said voltage value by a specific gain coefficient;
a storage unit for storing gain counts used in said voltage converting gain counting circuit, and
means for sending gain counts stored in said storage unit to said voltage converting gain counting circuit.

2. A voltage measuring apparatus for sheathed power cable according to claim 1 further comprising communications means for exchanging data with the outside and a second storage unit for storing received gain counts when having received a gain coefficient via said communications means.

3. A voltage measuring apparatus for sheathed power cable according to claim 2 characterized in that said communications means is for radio communications.

4. A voltage measuring apparatus for sheathed power cable according to claim 3 further comprising a third conductive member electrically connected to said first conductive member and said cable conductor.

5. A voltage measuring apparatus for sheathed power cable according to characterized in that the portion of said conductive member electrically connected to said able conductor is formed in a thumbtack.

6. A voltage measuring apparatus for sheathed power cable according to claim 5 characterized in that said second conductive member is formed to cover said first conductive member.

7. A voltage measuring apparatus for sheathed power cable according to claim 6 characterized in that the portion of said first conductive member in contact with said sheathing material has either a concavo-convex or wavy portion.

8. A voltage measuring apparatus for sheathed power cable according to claim 7 characterized in that the portion of said first conductive member in contact with said sheathing material has a concave portion.

9. A voltage measuring apparatus for sheathed power cable according to claim 8 characterized in that said voltage measuring apparatus has an insulating enclosure arranged to cover said first conductive member, and the end of said enclosure the direction where the power cable is extended is longer than that of said first conductive member in the direction where the power cable is extended.

10. A voltage measuring apparatus for sheathed power cable according to claim 8 further comprising:
a third conductive member electrically connected to said first conductive member and said cable conductor, and
an insulating enclosure arranged to cover said first conductive member and third conductive member.

11. A calibrator for a power cable voltage measuring apparatus comprising:
means for calculating a voltage applied to the power cable by multiplying a certain voltage value by a gain count,
communications means, for communicating with the outside, and
means for changing said gain count based on information received from said communications means;
said calibrator further comprising:
a voltage measuring apparatus for measuring the power cable voltage according to claim 10;
means for getting information to change said gain counting based on the measured voltage, and
means for sending the obtained information to said power cable voltage measuring apparatus.

12. A calibrator for a power cable voltage measuring apparatus according to claim 11 comprising:
means for receiving voltage value measured by said power cable voltage measuring apparatus, and
means for obtaining the voltage difference between the received voltage value and the voltage value measured by said voltage measuring means, and for changing gain counts used by said power cable voltage measuring apparatus based on said voltage difference.

13. A calibrator for a power cable voltage measuring apparatus according to claim 11 characterized in that said voltage measuring means has a joint provided with a part of the enclosure of said voltage measuring apparatus for sheathed power cable and said first conductive member, and said joint is either hook-shaped or U-shaped.

* * * * *